US012597839B2

(12) United States Patent
Chen et al.

(10) Patent No.: US 12,597,839 B2
(45) Date of Patent: Apr. 7, 2026

(54) BUTTON MECHANISM

(71) Applicant: Quanta Computer Inc., Taoyuan City (TW)

(72) Inventors: Chun-Lung Chen, Taoyuan City (TW); Chih-Ching Hsieh, Taoyuan City (TW); Chun-Feng Yeh, Taoyuan City (TW)

(73) Assignee: QUANTA COMPUTER INC., Taoyuan City (TW)

( * ) Notice: Subject to any disclaimer, the term of this patent is extended or adjusted under 35 U.S.C. 154(b) by 611 days.

(21) Appl. No.: 18/154,371

(22) Filed: Jan. 13, 2023

(65) Prior Publication Data

US 2024/0136905 A1 Apr. 25, 2024
US 2024/0235355 A9 Jul. 11, 2024

(30) Foreign Application Priority Data

Oct. 20, 2022 (TW) ................................. 111211410

(51) Int. Cl.
$H02K\ 33/12$ (2006.01)
$A63F\ 13/285$ (2014.01)
$H01H\ 13/85$ (2006.01)

(52) U.S. Cl.
CPC ............ *H02K 33/12* (2013.01); *A63F 13/285* (2014.09); *H01H 13/85* (2013.01); *H03K 2217/96062* (2013.01)

(58) Field of Classification Search
CPC ........ A63F 13/285; H03K 2217/96062; H01F 21/065; H01F 7/0205; H01H 36/004; H01H 13/84; H01H 13/85

USPC .......................................................... 463/37
See application file for complete search history.

(56) References Cited

U.S. PATENT DOCUMENTS

2017/0330710 A1* 11/2017 Robinson ............... H01H 13/86

FOREIGN PATENT DOCUMENTS

CN 113363100 A * 9/2021 ............. H01H 13/14
DE 102018112501 A1 * 11/2019 ............... G05G 5/03
JP 2013251053 A * 12/2013

OTHER PUBLICATIONS

Mao (CN 113363100 A) English Translation. (Year: 2021).*
Schramm (DE 102018112501 A1) English Translation (Year: 2019).*
Nishidate (JP 2013251053 A) English Translation (Year: 2013).*

* cited by examiner

*Primary Examiner* — Tulsidas C Patel
*Assistant Examiner* — Robert E Mates
(74) *Attorney, Agent, or Firm* — McClure, Qualey & Rodack, LLP

(57) ABSTRACT

A button mechanism is provided, including a button element, a magnet connected to the button, a hollow tube, a first coil, and a second coil. The first and second coils are disposed on the tube. When the first coil generates a first magnetic field, the magnet is magnetically attracted by the first coil, and the button element is positioned in the first position. When the second coil generates a second magnetic field, the magnet is attracted by the second coil, and the button element is positioned in the second position.

8 Claims, 7 Drawing Sheets

100

BUTTON MECHANISM

CROSS REFERENCE TO RELATED APPLICATIONS

This Application claims priority of Taiwan Patent Application Ser. No. 111211410, filed on Oct. 20, 2022, the entirety of which is incorporated by reference herein.

BACKGROUND OF THE INVENTION

Field of the Invention

The application relates in general to a button mechanism, and in particular, to a button mechanism that has a magnet and a plurality of coils.

Description of the Related Art

Conventional button mechanisms on the controllers of video game consoles and computers usually have only one single stroke of press. As a result, it would be difficult for users to experience different tactile sensations in different situations of operation.

Therefore, it has become a challenge to design a button mechanism capable of two or three different strokes of press.

BRIEF SUMMARY OF INVENTION

In view of the aforementioned problems, the object of the invention is to provide a button mechanism that includes a button element, a magnet connected to the button element, a hollow tube, a first coil, and a second coil. The first coil is disposed on the tube, wherein when the first coil generates a first magnetic field, the magnet is magnetically attracted by the first coil, and the button element is positioned in the first position relative to the tube. The second coil is disposed on the tube, wherein when the second coil generates a second magnetic field, the magnet is attracted by the second coil, and the button element is positioned in the second position relative to the tube.

In some embodiments, the tube has a first end portion and a second end portion, and the button mechanism further comprises a vibrator, wherein the button element is located adjacent to the first end portion, and the vibrator is disposed on the second end portion.

In some embodiments, the vibrator forms a recess, and the second end portion is engaged in the recess.

In some embodiments, the vibrator further forms a protrusion extending toward the magnet, and the recess surrounds the protrusion.

In some embodiments, when an external force is applied to the button element, the button element and the magnet slide along the tube, and the vibrator generates a vibration signal through the protrusion to the magnet and the button element.

In some embodiments, the button mechanism further comprises a holder connected to the button element, and the magnet is disposed on the holder.

In some embodiments, the button mechanism further comprises a connecting member that has resilient material and connects the button element to the holder.

In some embodiments, the second coil is closer to the vibrator than the first coil.

In some embodiments, the button mechanism further comprises a third coil disposed on the tube, and when the third coil generates a third magnetic field, the magnet is attracted by the third coil, whereby the button element is positioned in the third position relative to the tube, and the second position is between the first and third positions.

In some embodiments, the vibrator comprises a Linear Resonant Actuator (LRA).

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the button mechanism are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

In the following detailed description of the preferred embodiments, reference is made to the accompanying drawings, and in which specific embodiments of which the invention may be practiced are shown by way of illustration. In this regard, directional terminology, such as "top," "bottom," "left," "right," "front," "back," etc., is used with reference to the orientation of the figures being described. The components of the present invention can be positioned in a number of different orientations. As such, the directional terminology is used for the purposes of illustration and is in no way limiting.

Figure 1:
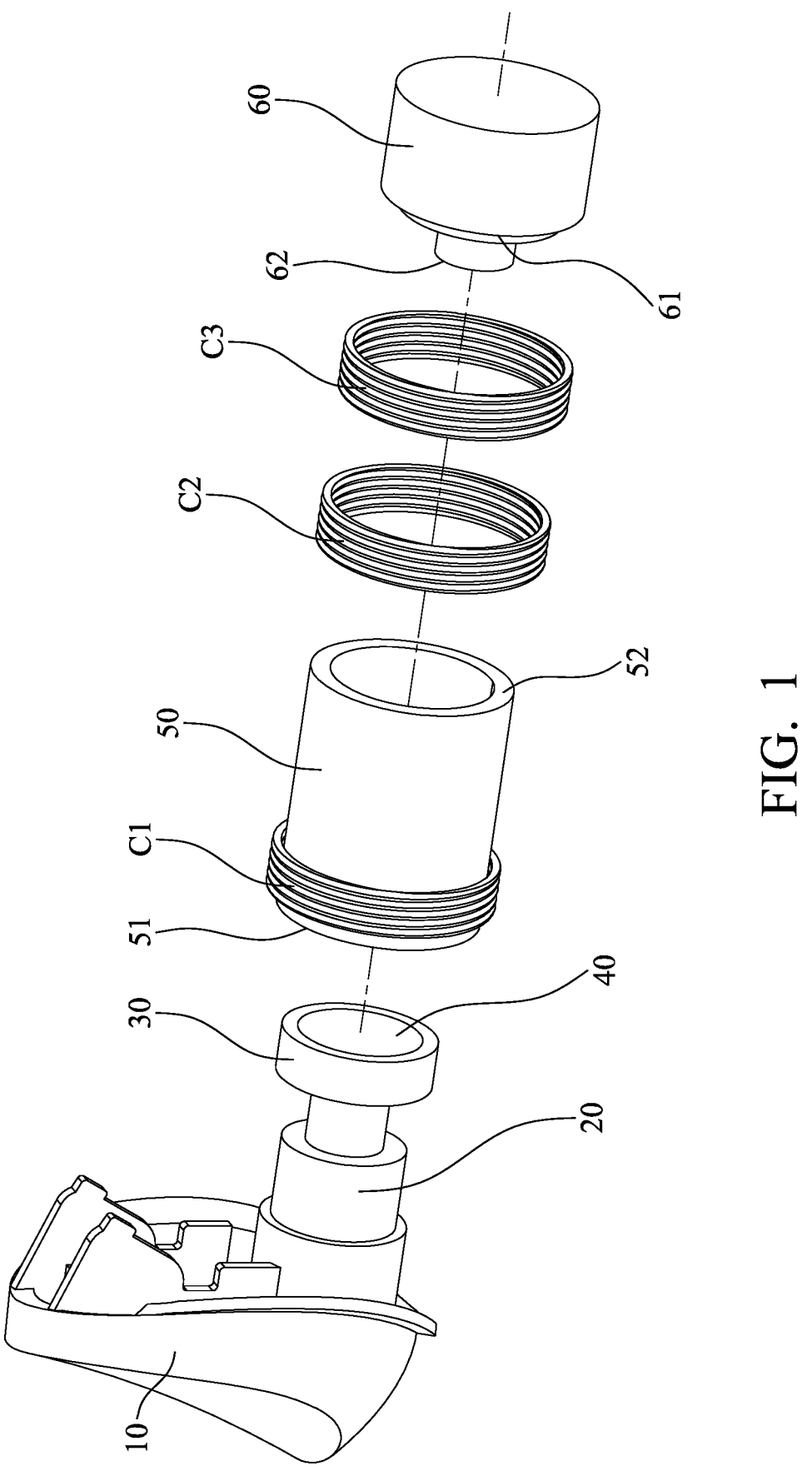
FIG. 1 is an exploded diagram of a button mechanism 100 in accordance with an embodiment of the invention.
Figure 2:
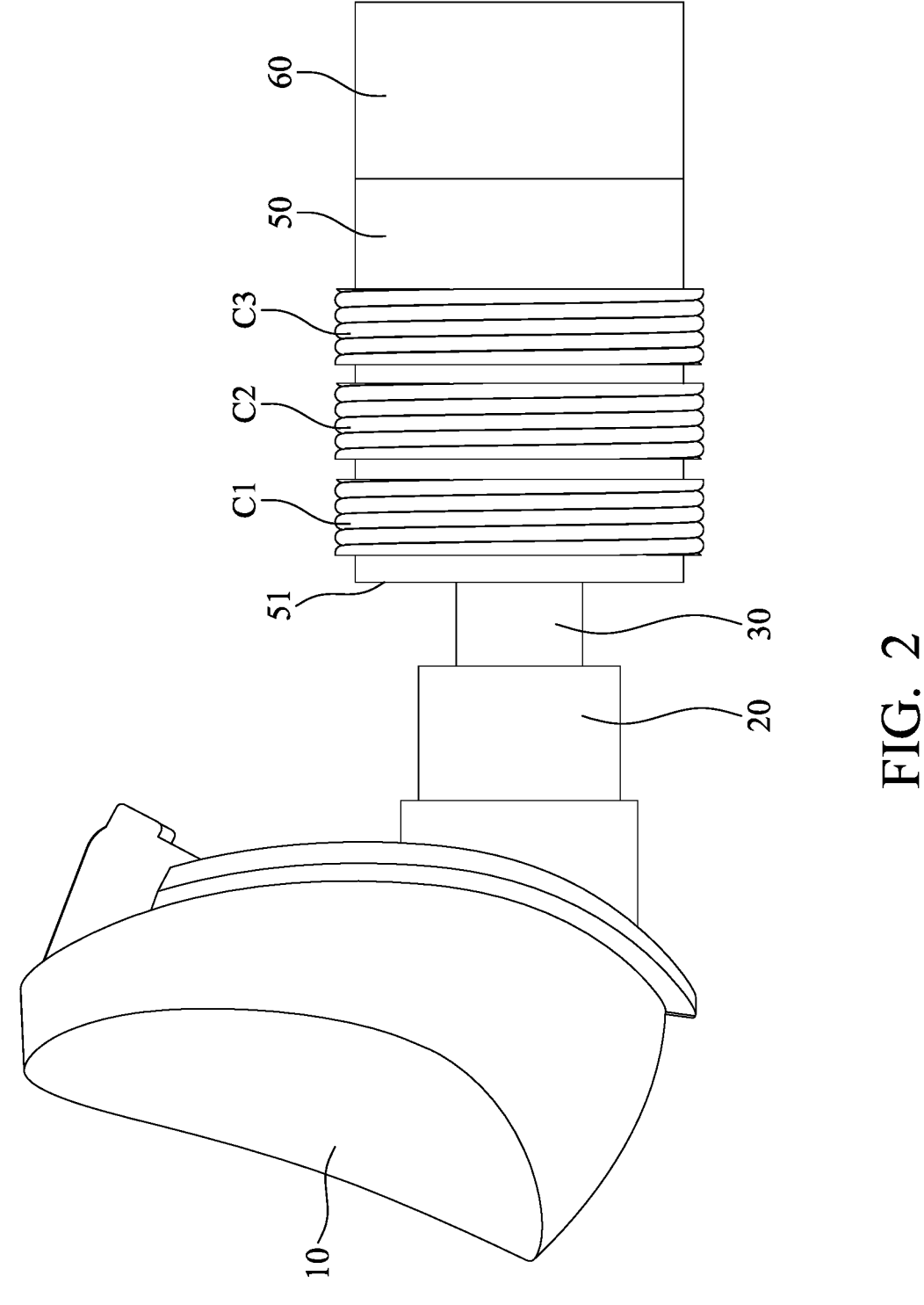
FIG. 2 is a side view of the button mechanism 100 of FIG. 1 after assembly.
Figure 3:
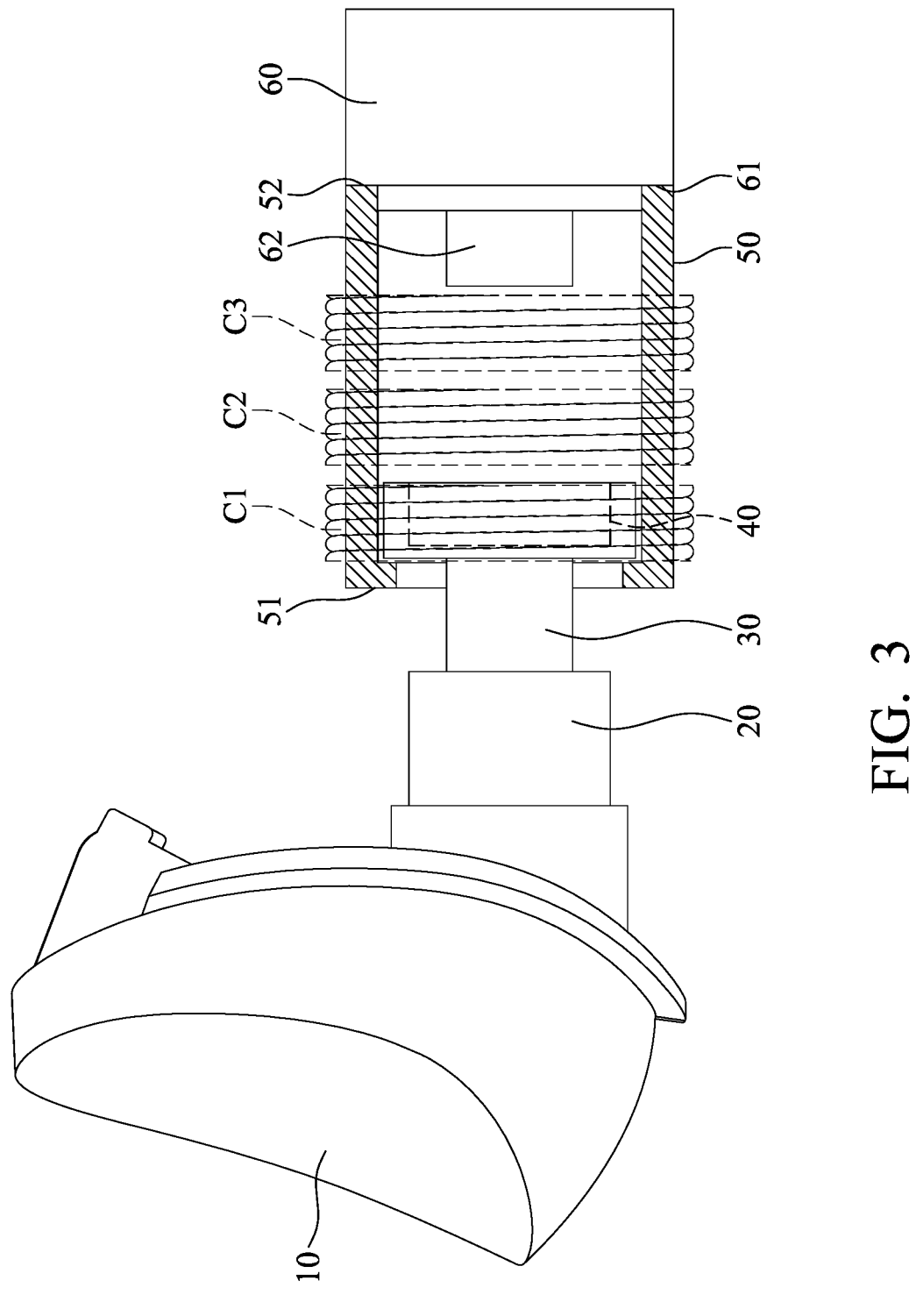
FIG. 3 is a partial cross-sectional view of the button mechanism 100 of FIG. 2, wherein the button element 10 is located in the first position relative to the tube 50.

FIG. 1 is an exploded diagram of a button mechanism 100 in accordance with an embodiment of the invention. FIG. 2 is a side view of the button mechanism 100 of FIG. 1 after assembly. FIG. 3 is a partial cross-sectional view of the button mechanism 100 of FIG. 2, wherein the button element 10 is located in the first position relative to the tube 50.

Referring to FIGS. 1-3, an embodiment a button mechanism 100 may be disposed on the controller of a video game console or computer. The button mechanism 100 primarily comprises a button element 10, a connecting member 20, a holder 30, a magnet 40, a hollow tube 50, a vibrator 60, a first coil C1, a second coil C2, and a third coil C3.

The connecting member 20 may comprise rubber or other resilient material. The connecting member 20 is connected between the button element 10 and the holder 30, and the magnet 40 is affixed in a cavity at the center of the holder 30. The first coil C1, the second coil C2, and the third coil C3 are wound around the tube 50.

In this embodiment, the vibrator 60 may comprise a Linear Resonant Actuator (LRA). An annular recess 61 is formed on a side of the vibrator 60. A protrusion 62 is formed at the center of the vibrator 60 and extends toward the magnet 40, and the recess 61 surrounds the protrusion 62.

As shown in FIGS. 1, 2 and 3, the tube 50 has a first end portion 51 and a second end portion 52. The button element 10 is located adjacent to the first end portion 51. The vibrator 60 is located adjacent to the second end portion 52, and the second end portion 52 is engaged in the recess 61.

It can be seen in FIGS. 2 and 3 that the holder 30 and the magnet 40 are inserted through the first end portion 51 into the tube 50 during assembly of the button mechanism 100. In this state, the button element 10 and the connecting member 20 protrude from and are exposed to the first end portion 51 of tube 50. Moreover, as the first coil C1 is electrically energized and generates a first magnetic field, the magnet 40 is affected by the first magnetic field and magnetically attracted by the first coil C1, whereby the magnet 40 is positioned at the center of the first coil C1, and the button element 10 is positioned in the first position relative to the tube 50.

Figure 4:
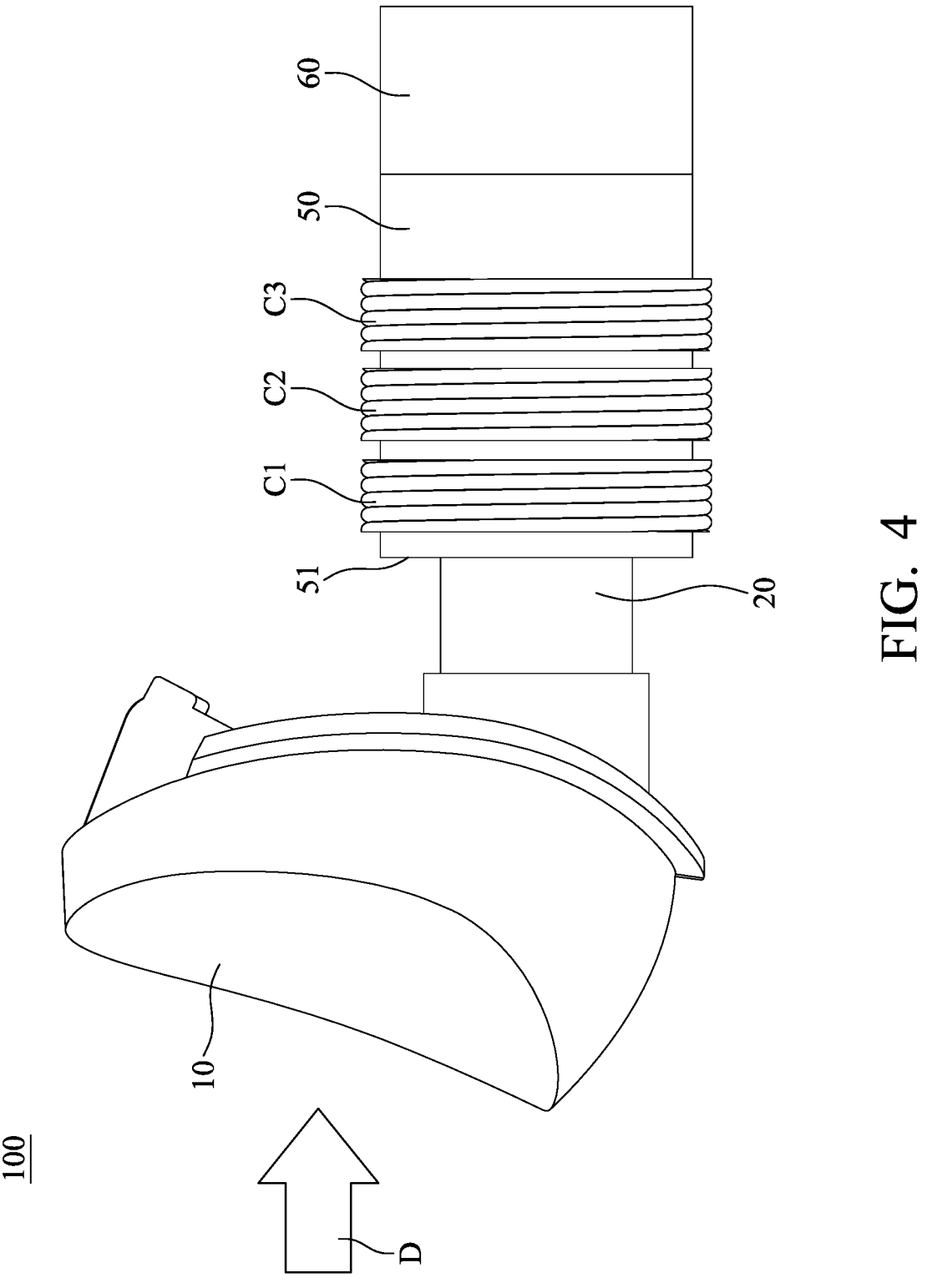
FIG. 4 is a side view of the button mechanism 100 when the button element 10 is located in the second position relative to the tube 50.

To trigger the button mechanism 100, the user can exert an external force and press the button element 10 with a finger in the direction D (FIG. 4). As a result, the button element 10, the connecting member 20, the holder 30, and the magnet 40 slide toward the vibrator 60 along the tube 50 to a limit position. Subsequently, the vibrator 60 may generate a vibration signal through the protrusion 62 to the magnet 40, and the vibration signal then propagates through the holder 30 and the connecting member 20 to the button element 10, thereby providing appropriate tactile feedback to the user's finger.

When the user's finger is released from the button element 10, the magnet 40 can be magnetically attracted by the first coil C1 again so that the button element 10 rapidly returns to the first position.

Figure 5:
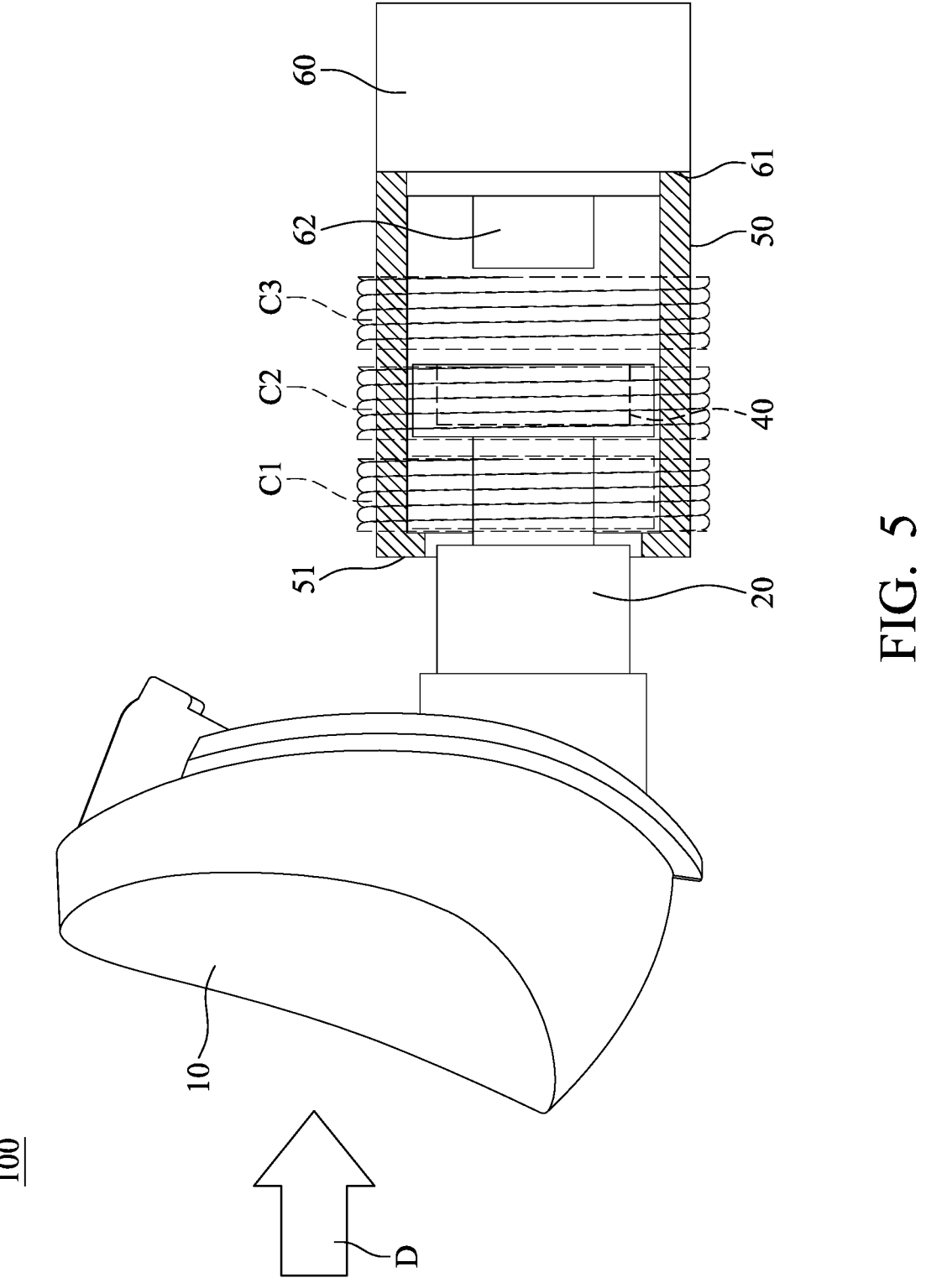
FIG. 5 is a partial cross-sectional view of the button mechanism 100 of FIG. 4, wherein the button element 10 is located in the second position relative to the tube 50.

FIG. 4 is a side view of the button mechanism 100 when the button element 10 is located in the second position relative to the tube 50. FIG. 5 is a partial cross-sectional view of the button mechanism 100 of FIG. 4, wherein the button element 10 is located in the second position relative to the tube 50.

Referring to FIGS. 4 and 5, to reduce the stroke of press and provide a different tactile feeling when pushing the button element 10 of the button mechanism 100, the first and third coils C1 and C3 may not be energized, and only the second coil C2 is electrically energized to generate a second magnetic field. Hence, the magnet 40 on the holder 30 can be affected by the second magnetic field and magnetically attracted by the second coil C2, whereby the magnet 40 is positioned at the center of the second coil C2, and the button element 10 is positioned in the second position relative to the tube 50. It should be noted that the second position is closer to the vibrator 60 than the first position.

To trigger the button mechanism 100 when in the state of FIGS. 4 and 5, the user can exert an external force and press the button element 10 with the finger in the direction D. As a result, the button element 10, the connecting member 20, the holder 30, and the magnet 40 slide toward the vibrator 60 along the tube 50 to the limit position. Subsequently, the vibrator 60 may generate a vibration signal through the protrusion 62 to the magnet 40, and the vibration signal then propagates through the holder 30 and the connecting member 20 to the button element 10, thereby providing appropriate tactile feedback to the user's finger.

With the user's finger released from the button element 10, the magnet 40 can be magnetically attracted by the second coil C2 again so that the button element 10 rapidly returns to the second position.

It should be noted that the second coil C2 is closer to the vibrator 60 than the first coil C1, and the button mechanism 100 can have a shorter stroke of press by positioning the button element 10 in the second position relative to the tube 50 (FIGS. 4 and 5). Thus, the users can experience different tactile feelings in different situations when using the video game consoles or the computers.

Figure 6:
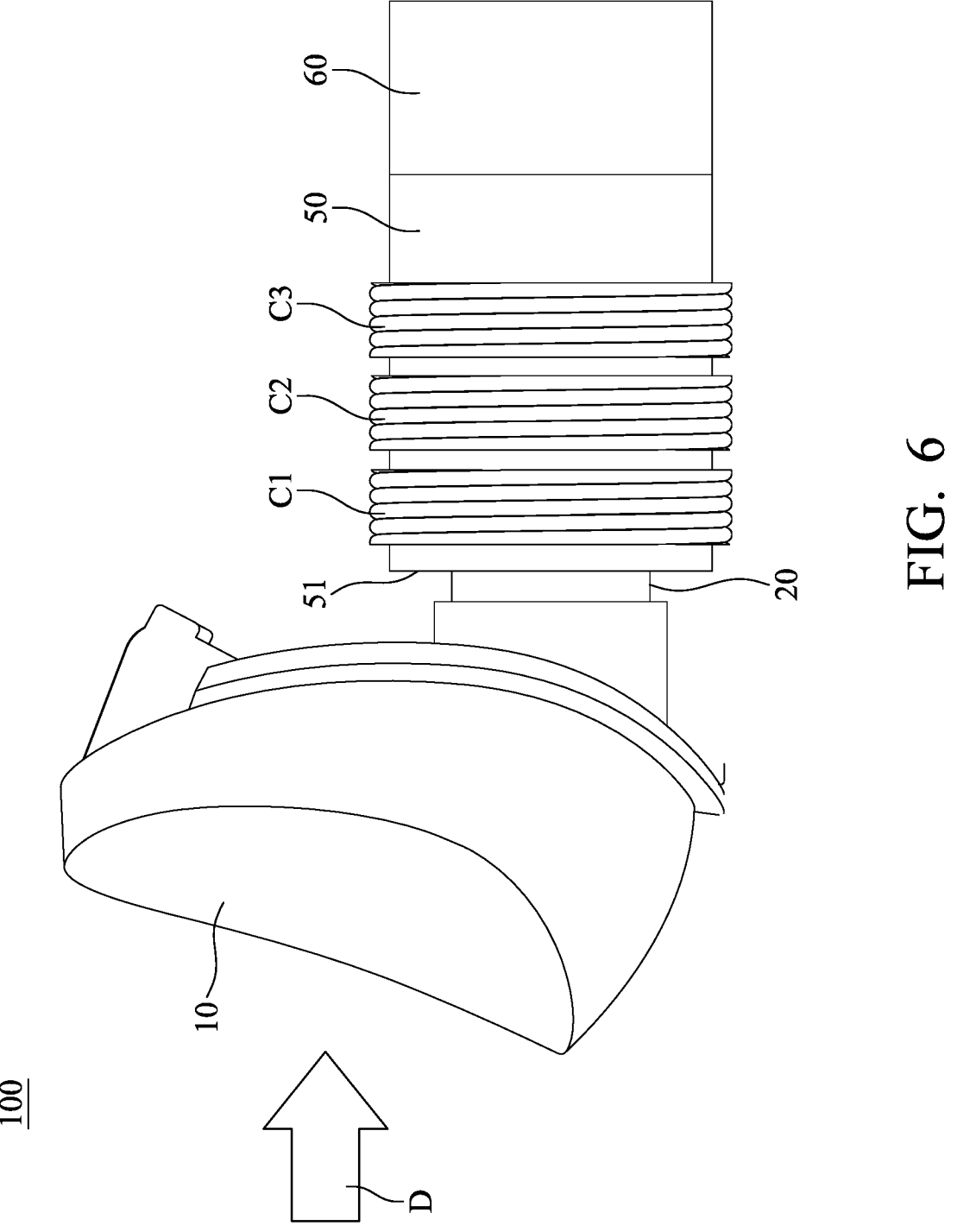
FIG. 6 is a side view of the button mechanism 100 when the button element 10 is located in the third position relative to the tube 50.
Figure 7:
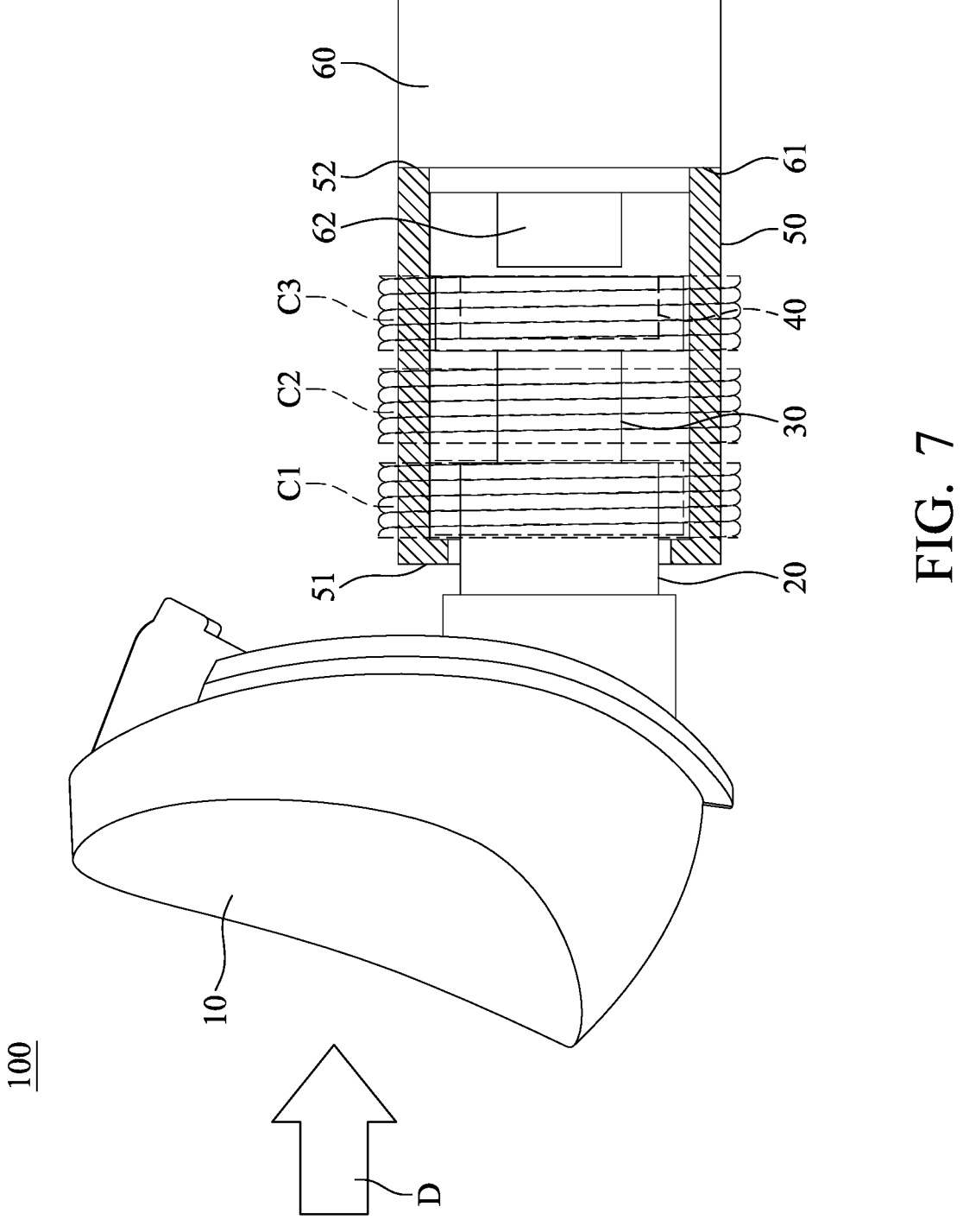
FIG. 7 is a partial cross-sectional view of the button mechanism 100 of FIG. 6, wherein the button element 10 is located in the third position relative to the tube 50.

FIG. 6 is a side view of the button mechanism 100 when the button element 10 is located in the third position relative to the tube 50. FIG. 7 is a partial cross-sectional view of the button mechanism 100 of FIG. 6, wherein the button element 10 is located in the third position relative to the tube 50.

Referring to FIGS. 6 and 7, to further reduce the stroke of press and provide a different tactile feeling when pushing the button element 10 of the button mechanism 100, the first and second coils C1 and C2 may not be energized, and only the third coil C3 is electrically energized to generate a third magnetic field. Hence, the magnet 40 on the holder 30 can be affected by the third magnetic field and magnetically attracted by the third coil C3, whereby the magnet 40 is positioned at the center of the third coil C3, and the button element 10 is positioned in the third position relative to the tube 50. It should be noted that the third position is closer to the vibrator 60 than the first and second positions.

To trigger the button mechanism 100 when in the state of FIGS. 6 and 7, the user can exert an external force and press the button element 10 with the finger in the direction D. As a result, the button element 10, the connecting member 20, the holder 30, and the magnet 40 slide toward the vibrator 60 along the tube 50 to the limit position. Subsequently, the vibrator 60 may generate a vibration signal through the protrusion 62 to the magnet 40, and the vibration signal then propagates through the holder 30 and the connecting member 20 to the button element 10, thereby providing appropriate tactile feedback to the user's finger.

When the user's finger is released from the button element 10, the magnet 40 can be magnetically attracted by the third coil C3 again so that the button element 10 rapidly returns to the third position.

It should be noted that the third coil C3 is closer to the vibrator 60 than the first and second coils C1 and C2, and the button mechanism 100 can have a further shorter stroke of press by positioning the button element 10 in the third position relative to the tube 50 (FIGS. 6 and 7). Thus, the users can experience different tactile feelings in different situations when using the video game consoles or the computers.

In this embodiment, the first coil C1 is located close to the button element 10, and the third coil C3 is located close to the vibrator 60. Additionally, the second coil C2 is located between the first and third coils C1 and C3, and the second position is located between the first and third positions.

In some embodiments, the button mechanism 100 may comprise the first and second coils C1 and C2 without the third coil C3. In some embodiments, the button mechanism 100 may comprise more than three coils to provide more than three different strokes of press, whereby the users can experience different tactile feelings in different situations when using video game consoles or the computers.

Additionally, the connecting member 20 and the holder 30 may be omitted from the button mechanism 100, and the magnet 40 can be directly disposed on the button element 10, not limited to the embodiments of the invention presented above.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A button mechanism, comprising:
a button element;
a magnet, connected to the button element,
a hollow tube;
a first coil, disposed on the tube, wherein when the first coil generates a first magnetic field, the magnet is magnetically attracted by the first coil, and the button element is positioned in a first position relative to the tube, and
a second coil, disposed on the tube, wherein when the second coil generates a second magnetic field, the magnet is attracted by the second coil, and the button element is positioned in a second position relative to the tube;
wherein the tube has a first end portion and a second end portion, the button mechanism further comprises a vibrator, the button element is located adjacent to the first end portion, and the vibrator is disposed on the second end portion;
wherein the vibrator forms a recess, and the second end portion is engaged in the recess.

2. The button mechanism as claimed in claim 1, wherein the vibrator further forms a protrusion extending toward the magnet, and the recess surrounds the protrusion.

3. The button mechanism as claimed in claim 2, wherein when an external force is applied to the button element, the button element and the magnet slide along the tube, and the vibrator generates a vibration signal through the protrusion to the magnet and the button element.

4. The button mechanism as claimed in claim 1, wherein the button mechanism further comprises a holder connected to the button element, and the magnet is disposed on the holder.

5. The button mechanism as claimed in claim 4, wherein the button mechanism further comprises a connecting member that has resilient material and connects the button element to the holder.

6. The button mechanism as claimed in claim 1, wherein the second coil is closer to the vibrator than the first coil.

7. The button mechanism as claimed in claim 1, wherein the button mechanism further comprises a third coil disposed on the tube, and when the third coil generates a third magnetic field, the magnet is attracted by the third coil, whereby the button element is positioned in a third position relative to the tube, and the second position is between the first and third positions.

8. The button mechanism as claimed in claim 1, wherein the vibrator comprises a Linear Resonant Actuator (LRA).

* * * * *